(12) United States Patent
Powers

(10) Patent No.: US 6,562,711 B1
(45) Date of Patent: May 13, 2003

(54) METHOD OF REDUCING CAPACITANCE OF INTERCONNECT

(75) Inventor: James Powers, Aloha, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/186,072

(22) Filed: Jun. 28, 2002

(51) Int. Cl.[7] .......................................... H01L 21/4763
(52) U.S. Cl. ...................... 438/622; 438/629; 438/634; 438/672; 438/675
(58) Field of Search ............................... 438/622, 629, 438/634, 672, 675

(56) References Cited

U.S. PATENT DOCUMENTS

| | | | | |
|---|---|---|---|---|
| 5,536,678 A | * | 7/1996 | Peek ........................... | 437/187 |
| 5,920,790 A | * | 7/1999 | Wetzel et al. ................ | 438/622 |
| 6,001,733 A | * | 12/1999 | Huang et al. ................ | 438/634 |
| 6,020,258 A | * | 2/2000 | Yew et al. .................... | 438/634 |
| 6,069,069 A | * | 5/2000 | Chooi et al. ................. | 438/634 |
| 6,124,200 A | * | 9/2000 | Wang et al. ................. | 438/624 |
| 6,146,987 A | * | 11/2000 | Wang et al. ................. | 438/672 |
| 6,444,517 B1 | * | 9/2002 | Hsu et al. .................... | 438/675 |
| 6,483,193 B2 | * | 11/2002 | Usami ......................... | 257/758 |
| 2001/0005625 A1 | * | 6/2001 | Sun ............................. | 438/634 |

* cited by examiner

Primary Examiner—John F. Niebling
Assistant Examiner—Lynne A. Gurley
(74) Attorney, Agent, or Firm—George Chen

(57) ABSTRACT

The present invention discloses a method of providing a substrate, the substrate having a first metal line and a second metal line isolated horizontally by a dielectric; forming an etch stop layer over the substrate; reducing thickness of the etch stop layer over the first metal line, leaving thickness unchanged over the second metal line; forming an interlayer dielectric (ILD) over the etch stop layer; and removing the ILD over the second metal line.

The present invention further discloses a structure that includes a substrate; a first metal line and a second metal line located over the substrate; a dielectric located over the substrate adjacent to the first metal line and the second metal line; an etch stop layer located over the first metal line, the second metal line, and the dielectric, the etch stop layer being thicker over the second metal line; and a via located over the thicker etch stop layer over the second metal line.

10 Claims, 3 Drawing Sheets

METHOD OF REDUCING CAPACITANCE OF INTERCONNECT

BACKGROUND OF THE INVENTION

1. Field of the Invention

The present invention relates to the field of semiconductor integrated circuit (IC) manufacturing, and more specifically, to a method of reducing capacitance of interconnect.

2. Discussion of the Related Art

In 1965, Gordon Moore first observed that the number of transistors per unit area on a chip appeared to double approximately every 18 months. Ever since then, the semiconductor industry has managed to introduce new designs and processes on schedule to deliver the improvement in device density projected by the so-called Moore's Law. In particular, major enhancements in optics and photolithography have reduced the critical dimension (CD) that can be successfully patterned in the features on a chip. At the same time, significant improvements in doping, deposition, and etch have decreased the concentration, depth, and thickness that can be precisely achieved across the chip.

The transistors in a chip are formed in a semiconductor material on a substrate, such as a wafer. The transistors are then wired with multiple layers of interconnects. The interconnects are formed from an electrically conducting material and are isolated by an electrically insulating material. The switching performance of the transistors depends on the resistance-capacitance (RC) product delay in the interconnects.

Thus, what is needed is a method of reducing capacitance of interconnect.

DETAILED DESCRIPTION OF THE PRESENT INVENTION

In the following description, numerous details, such as specific materials, dimensions, and processes, are set forth in order to provide a thorough understanding of the present invention. However, one skilled in the art will realize that the invention may be practiced without these particular details. In other instances, well-known semiconductor equipment and processes have not been described in particular detail so as to avoid obscuring the present invention.

The present invention describes a method of reducing capacitance of interconnect. In one embodiment, an etch stop layer is deposited, patterned, and reduced in thickness everywhere except in the vicinity over a metal line where a via is to be etched. The thicker portion has a sufficient thickness to serve as a landing pad for the subsequent via etch. The thinner portion, which includes the majority of the etch stop layer, decreases the equivalent dielectric constant value of the dielectric stack over a metal line, resulting in a reduction in both intralayer and interlayer metal capacitance.

An embodiment of a method of reducing capacitance of interconnect according to the present invention is shown in FIGS. 1(a)–(i).

Figure 1A:
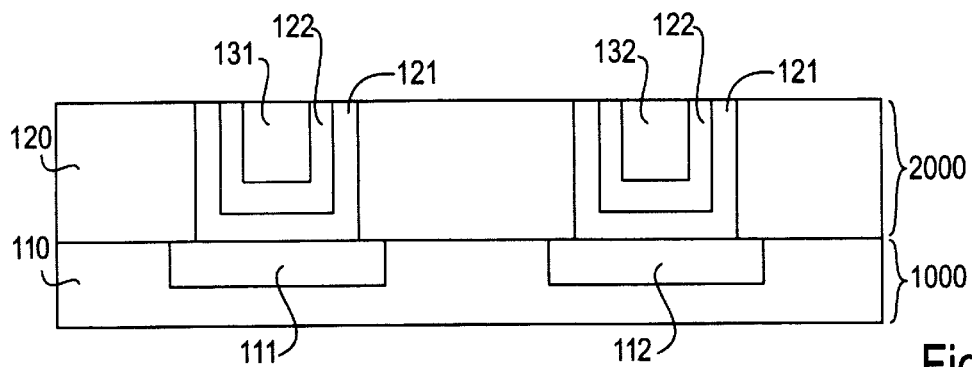
FIGS. 1(a)–(i) are illustrations of a cross-sectional view of a method of reducing capacitance of interconnect according to the present invention.
Figure 1B:
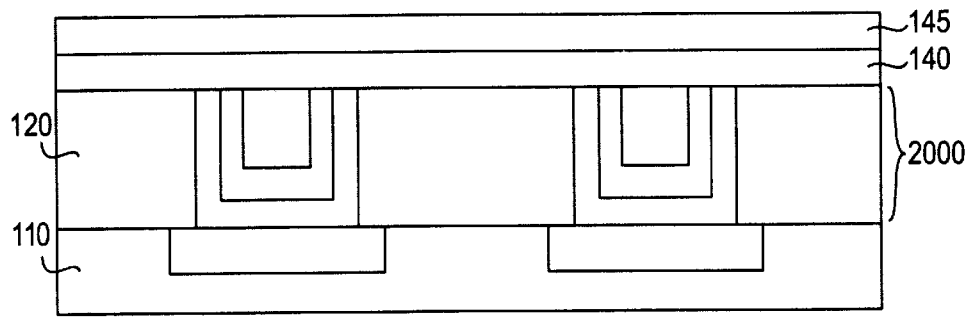
Figure 1C:
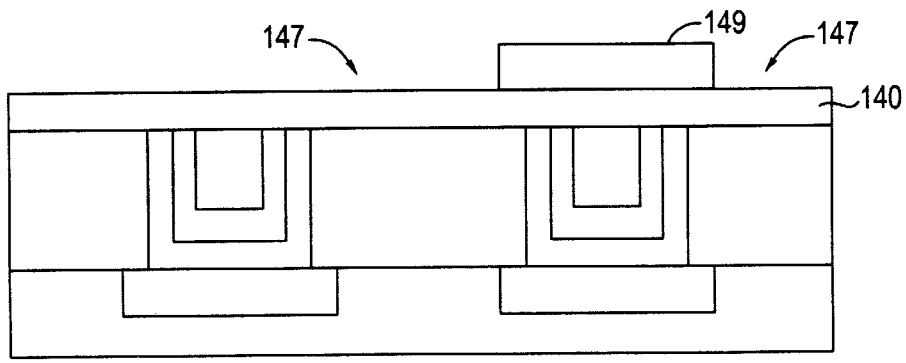
Figure 1D:
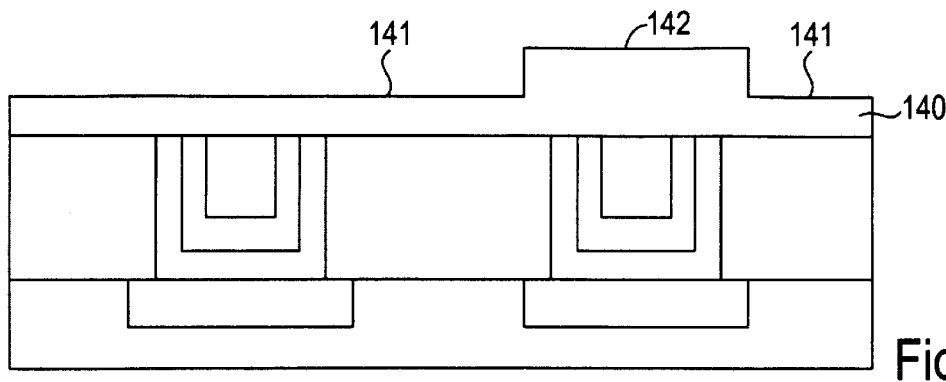
Figure 1E:
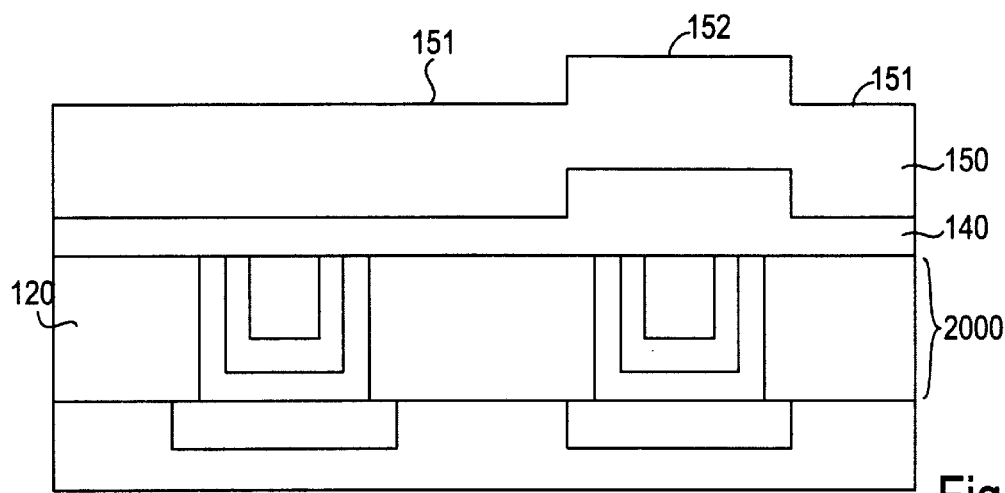

As shown in an embodiment in FIG. 1(a), a substrate 1000, such as a wafer, may include a semiconductor material 110, such as Silicon. A first device 111 and a second device 112 may be formed in or on the semiconductor material 110. The substrate 1000 may be covered with an interconnect layer 2000.

The interconnect layer 2000 may include a first metal line 131 and a second metal line 132. The first metal line 131 may be connected to the first device 111 while the second metal line 132 may be connected to the second device 112. The metal lines 131,132 may include Copper.

The Copper in the metal lines 131, 132 may be formed by an electrochemical process, such as electroplating. In other embodiments, the metal lines 131, 132 may be formed with a physical vapor deposition (PVD) process or a chemical vapor deposition (CVD) process. A PVD process or a CVD process may be particularly advantageous when forming metal lines 131, 132 with a large aspect ratio (depth:width), such as about 6:1 or greater. In some cases, a metal-organic CVD (MOCVD) process may also be used.

The metal lines 131, 132, may be treated after being formed to modify their material properties or surface characteristics. The treatment may include a rapid thermal anneal (RTA) process after deposition to modify or stabilize the grain size. Copper that has been formed by electroplating may have a grain size of about 0.05–10.0 um, depending on the thickness, deposition conditions, and anneal conditions. A larger grain size usually corresponds to a lower resistivity. For example, Copper may have a resistivity of about 1.0–4.0 micro-ohm-centimeter.

A dielectric 120 may isolate the first metal line 131 and the second metal line 132 from each other and from other metal lines on the same layer. The dielectric 120 has a dielectric constant, k, value that may be determined by using capacitance measurements on parallel plate electrical structures. The dielectric 120 may have a thickness selected from a range of about 0.2–1.7 microns (um).

Capacitance may affect the performance of the devices 111, 112 in the substrate 1000. When the devices 111, 112 include transistors, excessive intralayer and interlayer capacitance may contribute to cross-talk and increase the resistance-capacitance (RC) product delay, thus degrading switching speeds.

As shown in an embodiment in FIG. 1(a), a barrier layer 121 encapsulates the sides and the bottom of the metal lines 131, 132. Copper has a high diffusivity so the barrier layer 121 is necessary to prevent diffusion of Copper into the dielectric 120 and the devices 111, 112. Otherwise, Copper will introduce mid-gap states into the semiconductor material 110 that may degrade carrier lifetime.

The barrier layer 121 may be formed from a metal, including a refractive metal, such as Tantalum (Ta), or an alloy, such as Titanium-Tungsten (TiW), or a ceramic, such as Tantalum-Nitride (TaN), Tantalum-Silicon-Nitride (TaSiN), Titanium-Nitride (TiN), or Tungsten-Nitride (WN). The barrier layer 121 may have a thickness selected from a range of about 5.0–60.0 nanometers (nm).

In one embodiment, the barrier layer 121 may include a lower layer of TaN to adhere to the dielectric 120 and an upper layer of Ta to adhere to the overlying seed layer 122. Such a bilayer may have a total thickness of about 15.0–35.0 nm.

High directionality is desired for forming the barrier layer 121, especially when the metal lines 131, 132 have a large aspect ratio (depth: width), such as 6:1 or greater. The technique of ionized physical vapor deposition (I-PVD) can deposit a material with better step coverage than other techniques, such as collimation sputtering or long-throw sputtering (LTS).

In certain cases, a MOCVD process may be used to form the barrier layer 121. Alternatively, the barrier layer 121 may be formed using atomic layer deposition (ALD), especially for a thickness of about 10.0 nm or less. ALD can provide good step coverage and good uniformity even while permitting the use of a low deposition temperature of about 200–400 degrees Centigrade.

When the metal lines 131, 132 are formed by electroplating, a seed layer 122 is formed over the barrier layer 121, as shown in an embodiment in FIG. 1(*a*). In order to serve as a base for electroplating, the seed layer 122 must be electrically conductive and continuous over the barrier layer 121. Adhesion loss of the seed layer 122 or interfacial reaction with the underlying barrier layer 121 should be prevented.

The seed layer 122 may be formed from the same or different materials as the metal lines 131,132. The seed layer 122 may include a metal, such as Copper, or an alloy. The seed layer 122 may have a thickness selected from a range of about 5.0–300.0 nm.

The seed layer 122 may be deposited by I-PVD, especially when the metal lines 131, 132 are formed by electroplating. If desired, the barrier layer 121 and the seed layer 122 may be sequentially deposited in a tool without breaking vacuum.

When the metal lines 131, 132 are formed by PVD, better material properties and surface characteristics may be achieved for the metal lines 131, 132 if the seed layer 122 is formed using CVD. The seed layer 122 may also be formed with ALD or electroless plating.

As shown in an embodiment in FIG. 1(*b*), an etch stop layer 140 is formed over the interconnect layer 2000. The etch stop layer 140 must be thick enough to prevent breakthrough from the subsequent via etch process and associated precleans and postcleans. The etch stop layer 140 usually has a k value that is higher than the k value for the dielectric 120 so the thickness of the etch stop layer 140 should be minimized. For example, materials that may be used for the etch stop layer 140 include Silicon Nitride ($Si_3N_4$) which has a k value of about 6.0 and Silicon Carbide (SiC) which has a k value of about 4.5.

A radiation-sensistive material, or photoresist, 145 is applied over the etch stop layer 140, as shown in an embodiment in FIG. 1(*b*). Then, the photoresist 145 is exposed using radiation of the appropriate wavelength and dose. The exposure is performed in an imaging tool, such as a stepper or a scanner, and modulated by a reticle. Exposure is followed by development of an opening 147 in the photoresist 145 to form a mask 149, as shown in an embodiment in FIG. 1(*c*). The opening 147 in the photoresist is derived from a feature on the reticle. The opening 147 defines the portion of the etch stop layer 140 to be etched while the mask 149 defines the shape and dimension of a landing pad to be used later for via etch.

The opening 147 patterned in the mask 149 may be transferred into the etch stop layer 140 by a partial etch, as shown in an embodiment in FIG. 1(*d*). A wet or dry etch process may be used. The partial etch reduces the thickness of the etch stop layer 140 in a thinner region 141 corresponding to the opening 147. The thickness of the etch stop layer 140 remains essentially unchanged under the mask 149 to form a thicker region 142 which will later serve as a landing pad for via etch. In one embodiment, the etch stop layer 140 may have a thickness of about 30.0 nm in the thinner region 141 and a thickness of about 100.0 nm in the thicker region 142.

In another embodiment, the opening 147 patterned in the mask 149 may be transferred into the etch stop layer 140 by a complete etch. A wet or dry etch may be used. The complete etch removes the etch stop layer 140 everywhere except under the mask 149. The thickness of the etch stop layer 140 remains essentially unchanged under the mask 149 to form a landing pad for the subsequent via etch. In one embodiment, the landing pad may have a thickness of about 100.0 nm. If the etch stop layer 140 is removed from over a metal line, another material may have to be formed to encapsulate the top of the metal line.

Next, an interlayer dielectric (ILD) 150 is formed over the etch stop layer 140, as shown in an embodiment in FIG. 1(*e*). The ILD 150 may be formed from the same or a different material from the dielectric 120 in the underlying interconnect layer 2000. The ILD 150 may include Silicon Oxide, having a k value of about 3.9–4.2. The ILD 150 may have a thickness selected from a range of about 0.2–1.7 um.

Intralayer and interlayer capacitance may be reduced by using a low-k material for the ILD 150. Low-k refers to a value of k that is lower than the k value of Silicon Oxide. Silicon Oxide may be doped with Fluorine to form a Fluorinated Silicate glass (FSG or SiOF), having a k value of about 3.3–3.7. FSG shares many similar properties with undoped Silica glass (USG) so process integration for FSG is relatively straightforward.

The k value of FSG may not be low enough for a device with design rules below about 180 nm so other low-k dielectric may be used. A low-k dielectric may include organic materials, silicate materials, or a hybrid of both organic and silicate materials, such as organosilicate glass (OSG). For example, Silicon Oxide may be doped with Methyl (—$CH_3$) groups to form a Carbon-doped Silicon Oxide (CDO or SiOC) having a k value of about 2.4–3.3.

For a device with design rules below about 90 nm, the ILD 150 may be formed from a low-k material having an ultra-low k. Ultra-low k refers to a k value that is lower than about 2.2. For a device with design rules below about 70 nm, the ILD 150 may be formed from a material having a k value below about 1.5. Materials with an ultra-low k include aerogels and xerogels. Process integration may be more difficult for materials with an ultra-low k due to poorer mechanical properties and, in many cases, the presence of pores.

The ILD 150 may be formed using a CVD process, including a plasma-enhanced CVD (PECVD) process. Alternatively, the ILD 150 may be a spin-on dielectric (SOD). Low-k materials that may be formed using a spin-on process from a liquid source include aromatic hydrocarbon polymers and hybrid organic-siloxane polymers. In some cases, the SOD may require the use of an adhesion layer.

In one embodiment, a flat upper surface may be formed on the ILD 150 with a deposition-etch PECVD process. More typically, the ILD 150 may be formed conformally, resulting in an upper surface that has a lower region 151 and a higher region 152, as shown in an embodiment in FIG. 1(*e*). The lower region 151 of the ILD 150 corresponds to the thinner region 141 of the etch stop layer 140. The higher region 152 of the ILD 150 corresponds to the thicker region 142 of the etch stop layer 140.

A planarization process may be used to planarize the upper surface of the ILD 150 prior to applying photoresist 155, as shown in FIG. 1(*f*). Planarization of the ILD 150 will result in an upper surface 154 that is approximately flat and level.

A chemical-mechanical polishing (CMP) process, which combines abrasion (mechanical forces) and dissolution (chemical or electrochemical reactions), may be optimized for planarization of different materials. The selectivity of a CMP process may be adjusted by changing the polish rates for different materials. Polish selectivity may be optimized by changing the properties of the polish pad, the properties of the polish slurry, and the parameters of the polish tool. When the ILD 150 is formed from a low-k material, the CMP process may be modified to avoid fracturing or delaminating the low-k material forming the ILD 150.

In one embodiment, the slurry may include an abrasive, such as Alumina or Silica, and a complexing agent. The complexing agent may include an alkali, such as Ammonium Hydroxide ($NH_4OH$) or Potassium Hydroxide (KOH). A relatively soft pad is used to prevent the generation of defects.

In one embodiment, a capping layer, such as Silicon Nitride ($Si_3N_4$) or Silicon Oxynitride (SiON), may be formed over the ILD 150 to prevent diffusion, intermixing, or reaction with other materials.

Figure 1F:
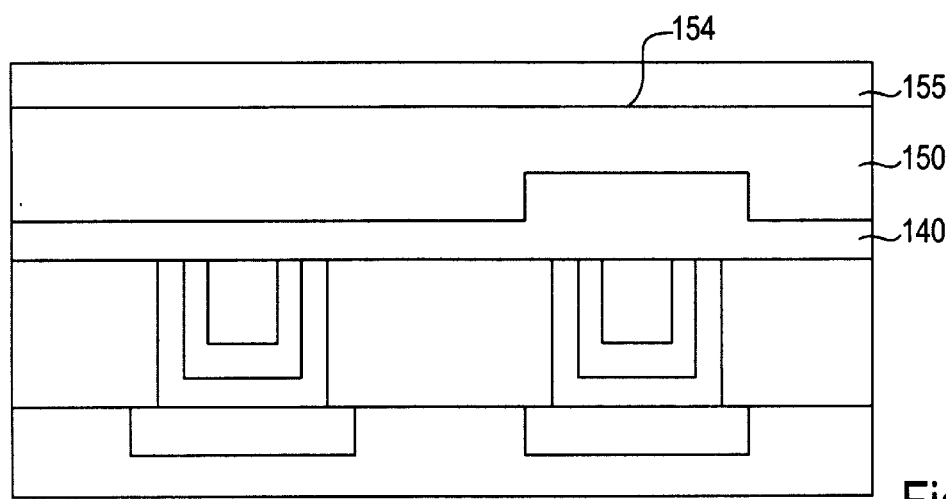
Figure 1G:
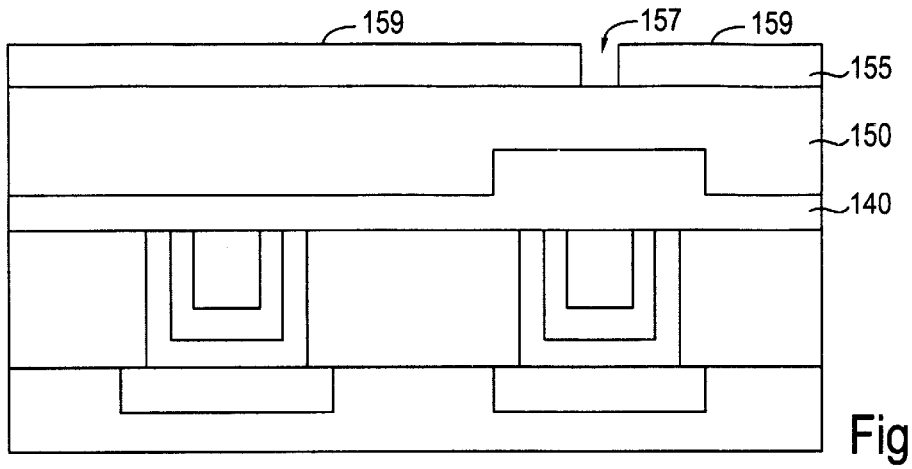

A photoresist 155, is applied over the planarized ILD 150, as shown in an embodiment in FIG. 1(f). Then, the photoresist 155 is exposed using radiation of the appropriate wavelength and dose. The exposure is performed in an imaging tool, such as a stepper or a scanner, and modulated by a reticle. Exposure is followed by development of an opening 157 in the photoresist 155 to form the mask 159, as shown in an embodiment in FIG. 1(g). The shape and dimension of the opening 157 is derived from a feature on the reticle.

In one embodiment, the ILD 150 is not planarized before applying photoresist 155 for the subsequent via etch. Instead, an anti-reflective coating (ARC) may be used to prevent exposure problems with the swing curve or with the light scattering due to the step height difference between the lower region 151 and the higher region 152 of the unplanarized ILD 150. The anti-reflective coating may be formed under the photoresist 155 as a bottom ARC (BARC) or formed over the photoresist 155 as a top ARC (TARC).

Figure 1H:
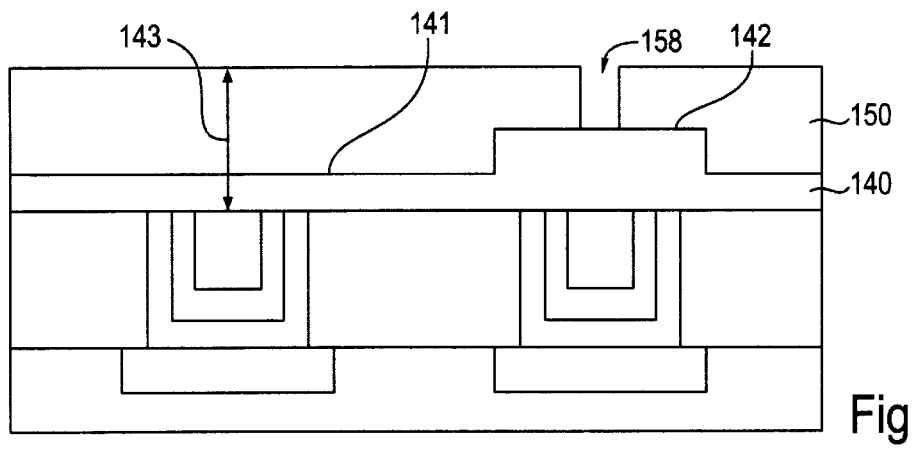

A dry etch process, such as a plasma etch process or a reactive ion etch process (RIE), may be used to etch the via 158, as shown in an embodiment in FIG. 1(h). High directionality is desired for the etch when the mask 159 has a large aspect ratio (depth:width), such as about 6:1 or greater. In one embodiment, a high density plasma, such as an inductively-coupled Radio Frequency (RF) plasma (ICP), may be used.

The dry etch of the ILD 150 to form the via 158 may be performed with a gas mixture. The gas mixture for an ILD 150 formed from an inorganic material may include an etching gas, such as $CF_4$, and a polymerizing gas, such as $CH_2F_2$. The etching gas is the principal source of Fluorine for etching the ILD 150 while the polymerizing gas improves selectivity by passivating the sidewalls of the via 158. The etch selectivity of the ILD 150 to the photoresist 155 in the mask 159 may be higher than about 20:1. Other gases that may be used for via etch include $CHF_3$ and $C_3F_6$. The etch rate of the ILD 150 may be about 150.0–1,200.0 nm/minute. The gas mixture for an ILD 150 formed from an organic material may include an oxidizing gas. If desired, the via etch and the photoresist 155 strip may be done sequentially in an integrated tool.

The thicker region 142 of the etch stop layer 140 forms a landing pad that is thick enough to prevent the via etch from breaking through to underlying layers. A via etch that breaks through the etch stop layer 140 may damage or decrease the thickness of the second metal line 132 or the barrier layer 121 that encapsulates the sidewalls of the second metal line 132.

The thicker region 142 of the etch stop layer 140 should be designed with an appropriate shape and sufficiently large dimensions to accommodate process tolerances that may arise from photolithography or etch. The design of the landing pad may depend on the variations in critical dimension (CD) of the via 158, CD of the second metal line 132, overlay of the via 158 to the landing pad, and overlay of the landing pad to the second metal line 132.

Via 158 density across the upper surface of the ILD 150 may only be a few percent. Thus, having a thinner region 141, rather than a thicker region 142, of the etch stop layer 140, wherever no via 158 will be etched, may decrease the equivalent k value of a dielectric stack 143 over the first metal line 131.

In one embodiment, partially etching the etch stop layer outside the landing pad may decrease the k value of the dielectric stack 143 over the first metal line by about 10.0%. Decreasing the equivalent k value of the dielectric stack 143 will reduce intralayer and interlayer capacitance of the interconnect.

In one embodiment, the ILD 150 is formed from CDO with a k value of about 2.8 and the etch stop layer 140 is formed from $Si_3N_4$. The equivalent k value of the dielectric stack 143 was about 3.6 when the etch stop layer 140 was not etched and had a uniform thickness of 100.0 nm. However, a partial etch of the etch stop layer 140, according to the present invention, produced a thickness of about 30.0 nm in the thinner region 141 and about 100.0 nm in the thicker region 142, and reduced the equivalent k value of the dielectric stack 143 to about 3.2.

Subsequent to via etch, a portion of the etch stop layer 140 below the via 158 may be removed, such as by a dry etch, as shown in an embodiment in FIG. 1(i). Later, barrier layer and metal will fill the opened via 159 to make electrical contact with the underlying metal line 132.

An unlanded opened via 159, relative to the underlying metal line 132, may be permitted by the design rules if acceptable performance and satisfactory reliability may be achieved despite current crowding and higher via resistance in the unlanded opened via 159. The underlying layers, including the second metal line 132, the barrier layer 121, and the ILD 150 should not be damaged by the removal of the etch stop layer 140 at the bottom of the opened via 159.

Figure 1I:
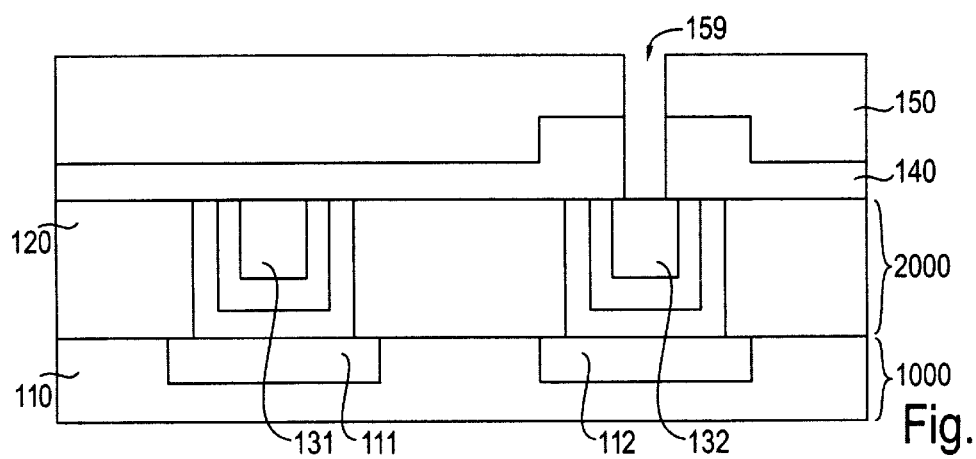

FIG. 1(i) also shows an embodiment of an interconnect structure having reduced capacitance due to having a patterned etch stop layer according to the present invention.

Many embodiments and numerous details have been set forth above in order to provide a thorough understanding of the present invention. One skilled in the art will appreciate that many of the features in one embodiment are equally applicable to other embodiments. One skilled in the art will also appreciate the ability to make various equivalent substitutions for those specific materials, processes, dimensions, concentrations, etc. described herein. It is to be understood that the detailed description of the present invention should be taken as illustrative and not limiting, wherein the scope of the present invention should be determined by the claims that follow.

Thus, we have described a method of reducing capacitance of interconnect.

We claim:

1. A method comprising:
providing a substrate, said substrate having a first metal line and a second metal line isolated by a dielectric;
forming an etch stop layer over said substrate;
partially reducing thickness of said etch stop layer over said first metal line, leaving thickness unchanged over said second metal line;

forming an interlayer dielectric (ILD) over said etch stop layer; and removing said ILD over said second metal line.

2. The method of claim 1 wherein said ILD comprises a Silicon Oxide.

3. The method of claim 1 wherein said ILD comprises a low-k material.

4. The method of claim 1 wherein said ILD comprises an ultra-low k material.

5. The method of claim 1 wherein said first metal line and said second metal line comprise Copper.

6. The method of claim 1 wherein said etch stop layer comprises Silicon Nitride.

7. The method of claim 1 wherein said etch stop layer comprises Silicon Carbide.

8. The method of claim 1 wherein said etch stop layer over said first metal line is reduced in thickness from about 100.0 nm to about 30.0 nm.

9. A method comprising:

providing a substrate, said substrate having a first metal line and a second metal line isolated by a dielectric;

forming an etch stop layer over said first metal line and said second metal line;

forming a landing pad over said second metal line by partially etching said etch stop layer outside said landing pad, including over said first metal line;

forming an interlayer dielectric (ILD) over said etch stop layer; and etching a via in said ILD down to said landing pad.

10. The method of claim 9 wherein partially etching said etch stop layer outside said landing pad may decrease dielectric constant, k, value of a dielectric stack over said first metal line by about 10.0%.

* * * * *